United States Patent
Wu et al.

(10) Patent No.: US 10,535,841 B2
(45) Date of Patent: Jan. 14, 2020

(54) ORGANIC LIGHT EMITTING DIODE DEVICE, DISPLAY DEVICE AND MANUFACTURING METHOD OF THE ORGANIC LIGHT EMITTING DIODE DEVICE

(71) Applicant: BOE Technology Group Co., Ltd., Beijing (CN)

(72) Inventors: Chang Yen Wu, Beijing (CN); Wei Quan, Beijing (CN); Chengyuan Luo, Beijing (CN); Juanjuan You, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 35 days.

(21) Appl. No.: 15/816,896

(22) Filed: Nov. 17, 2017

(65) Prior Publication Data

US 2018/0315958 A1  Nov. 1, 2018

(30) Foreign Application Priority Data

Apr. 28, 2017 (CN) .......................... 2017 1 0295471

(51) Int. Cl.
*H01L 51/52* (2006.01)
*H01L 51/56* (2006.01)
*H01L 51/00* (2006.01)
*H01L 29/08* (2006.01)
*H01L 35/24* (2006.01)

(52) U.S. Cl.
CPC .......... *H01L 51/5271* (2013.01); *H01L 51/56* (2013.01); *H01L 51/5234* (2013.01); *H01L 51/5275* (2013.01)

(58) Field of Classification Search
CPC combination set(s) only.
See application file for complete search history.

(56) References Cited

U.S. PATENT DOCUMENTS

| | | | |
|---|---|---|---|
| 6,608,660 B1* | 8/2003 | Okamoto | .......... G02F 1/133512 349/106 |
| 9,515,283 B2* | 12/2016 | Liu, Jr. | ............... H01L 51/0067 |

(Continued)

FOREIGN PATENT DOCUMENTS

| CN | 103503571 A | 1/2014 |
|---|---|---|
| CN | 103715368 A | 4/2014 |

(Continued)

OTHER PUBLICATIONS

Notification of hte First Office Action issued in Chinese Patent Application No. 201710295471.3, dated Apr. 28, 2018; with English translation.

*Primary Examiner* — Nduka E Ojeh
(74) *Attorney, Agent, or Firm* — McDermott Will & Emery LLP

(57) ABSTRACT

An organic light emitting diode device, includes a substrate, and a first electrode, an organic layer and a second electrode successively arranged on the substrate, wherein the first electrode and the second electrode are both transparent electrodes; the organic light emitting diode device further includes a metal packaging layer, wherein the metal packaging layer is located on a side of the second electrode back to the first electrode, and a surface of the metal packaging layer facing the second electrode is a rough surface.

4 Claims, 3 Drawing Sheets

(56) References Cited

U.S. PATENT DOCUMENTS

| | | | | |
|---|---|---|---|---|
| 2004/0061136 A1* | 4/2004 | Tyan | .................... | H01L 51/5268 257/200 |
| 2006/0188697 A1* | 8/2006 | Lee | ..................... | H01L 51/0013 428/156 |
| 2008/0048561 A1* | 2/2008 | Cheng | ................. | H01L 51/5092 313/504 |
| 2012/0313887 A1* | 12/2012 | Chen | ....................... | G06F 3/044 345/174 |
| 2013/0244377 A1* | 9/2013 | Arimitsu | ................. | H01L 24/96 438/118 |
| 2014/0027753 A1* | 1/2014 | Yamana | .............. | H01L 51/5209 257/40 |
| 2014/0055715 A1* | 2/2014 | Lee | ................... | G02F 1/133528 349/62 |
| 2014/0131067 A1* | 5/2014 | Liu | ........................ | H05K 3/048 174/251 |
| 2015/0179977 A1* | 6/2015 | Inada | .................. | H01L 51/5262 257/40 |
| 2015/0234209 A1* | 8/2015 | Miyamoto | ......... | G02B 27/0018 351/159.55 |
| 2015/0340658 A1* | 11/2015 | Higashika | ............... | H01L 51/52 257/40 |
| 2015/0380677 A1* | 12/2015 | Wu | ..................... | H01L 51/5209 257/40 |

FOREIGN PATENT DOCUMENTS

| | | | |
|---|---|---|---|
| CN | 105977393 | A | 9/2016 |
| JP | 2008-010211 | A | 1/2008 |
| KR | 10-2016-0009892 | A | 1/2016 |
| TW | 201417370 | A | 5/2014 |
| WO | 2013/083712 | A1 | 6/2013 |

\* cited by examiner

ORGANIC LIGHT EMITTING DIODE DEVICE, DISPLAY DEVICE AND MANUFACTURING METHOD OF THE ORGANIC LIGHT EMITTING DIODE DEVICE

CROSS-REFERENCE TO RELATED APPLICATION

This application claims priority to Chinese Patent Application No. 201710295471.3, filed on Apr. 28, 2017, titled "ORGANIC LIGHT EMITTING DIODE DEVICE AND MANUFACTURING METHOD THEREOF, AND DISPLAY DEVICE", which is incorporated herein by reference in its entirety.

TECHNICAL FIELD

The present disclosure relates to a display technology, more particularly, to an organic light emitting diode device and manufacturing method thereof, and display device.

BACKGROUND

Organic Light Emitting Diode (OLED) device is also known as organic electroluminescent diode device. OLED has attracted extensive attention due to its advantages of being self-luminous, rich colors, fast response, wide viewing angle, light weight, thin thickness, low power consumption, flexible display and so on. Moreover, the display device fabricated by OLED is considered as a display device with great application prospects.

SUMMARY

The embodiments of the present disclosure adopt the following technical solutions. In the first aspect, the embodiments of the present disclosure provide an organic light emitting diode device, which includes a substrate, and a first electrode, an organic layer and a second electrode successively arranged on the substrate. The first electrode and the second electrode are both transparent electrodes. The organic light emitting diode further includes a metal packaging layer. The metal packaging layer is located on a side of the second electrode back to the first electrode, and the surface of the metal packaging layer facing the second electrode is a rough surface.

Optionally, the organic light emitting diode device further includes a light matching layer, which is located between the second electrode and the metal packaging layer.

Optionally, the absolute value of the difference between the refractive index of the light matching layer and that of the second electrode is substantially smaller than or equal to 0.2.

Optionally, the refractive index of the light matching layer is substantially smaller than that of the second electrode.

Optionally, the refractive index of the light matching layer is about 1.8-2.2.

Optionally, the light matching layer is an optical adhesive layer or a pressure-sensitive adhesive layer.

Optionally, the light reflectivity of the metal packaging layer is substantially greater than or equal to 80%.

Optionally, the light transmittance of the second electrode is substantially greater than or equal to 70%.

Optionally, the metal packaging layer is made of invar alloy, or stainless steel, or one of aluminium, cobalt, nickel, chromium, iron, platinum, palladium, manganese, and silver, or an alloy consisting of at least two of aluminum, cobalt, nickel, chromium, iron, platinum, palladium, manganese, and silver.

In the second aspect, the embodiments of the present disclosure provide a display device, which is provided with the organic light emitting diode device as described above.

In the third aspect, the embodiments of the present disclosure provide a manufacturing method of the organic light emitting diode device, which includes:

forming a substrate;

forming a first electrode, an organic layer and a second electrode on the substrate successively; and forming a metal packaging layer on a side of the second electrode back to the first electrode, wherein a surface of the metal packaging layer facing the second electrode is a rough surface.

Optionally, the step of forming a metal packaging layer on a side of the second electrode back to the first electrode includes:

forming a metal film on a carrier substrate;

separating the metal film from the carrier substrate, and attaching the metal film to a side of the second electrode back to the first electrode.

Optionally, after the step of forming a metal film on a carrier substrate, and before the step of separating the metal film from the carrier substrate and attaching the metal film to a side of the second electrode back to the first electrode, the manufacturing method of the organic light emitting diode device further includes:

foughing a surface of the metal film back to the carrier substrate.

Optionally, after the step of forming a first electrode, an organic layer and a second electrode on the substrate successively, and before the step of forming a metal packaging layer on a side of the second electrode back to the first electrode, the manufacturing method of the organic light emitting diode device further includes:

forming a light matching layer on the surface of the second electrode back to the first electrode.

Optionally, the step of forming a light matching layer on the surface of the second electrode back to the first electrode includes:

forming a solid state film; and attaching the solid film to the surface of the second electrode back to the first electrode;

or, forming a light matching film on the surface of the second electrode back to the first electrode by coating or printing; and curing the light matching film by UV irradiation or thermal curing.

BRIEF DESCRIPTION OF THE DRAWINGS

The accompanying drawings described here are used to provide further understanding of the disclosure and constitute a part of the disclosure. The illustrative embodiments of the disclosure and instructions serve to explain the disclosure, but do not constitute improper limitation to the disclosure. In the accompanying drawings.

DETAILED DESCRIPTION

In order to further explain the organic light emitting diode (OLED) device and the manufacturing method thereof, and the display device provided by the embodiments of the present disclosure, the following is described in detail with reference to the accompanying drawings of the specification.

There are some organic light emitting diode devices, the basic structure of which is a sandwich structure consisting of an anode, a cathode and an organic layer between the anode and the cathode. The anode is generally a layer of Indium Tin Oxide (ITO), which is thin and transparent and has semiconductor properties. The cathode is generally a metal layer. When a voltage is applied to the organic light emitting diode device, holes output from the anode and electrons output from the cathode are combined in a light emitting layer of the organic layer, so as to excite the light emitting layer to emit light, and thus to realize light emitting of the organic light emitting diode device. The light emitted by the light emitting layer passes through the anode. However, a portion of the light emitted by the light emitting layer will be incident to the cathode, and a Surface Plasmons Polaritons mode (SPP mode) is easily formed at the interface between the cathode and the organic layer. The portion of the light will not be emergent to the outside of the organic light emitting diode device, resulting in the reduction of light extraction efficiency of organic light emitting diode device.

In order to solve the above problems, the embodiments of the present disclosure provide another type of organic light emitting diode device. Such organic light emitting diode device can solve the technical problem that the light extraction efficiency of organic light emitting diode device is reduced because a portion of light will not be emergent to the outside of the organic light emitting diode device.

Figure 1:
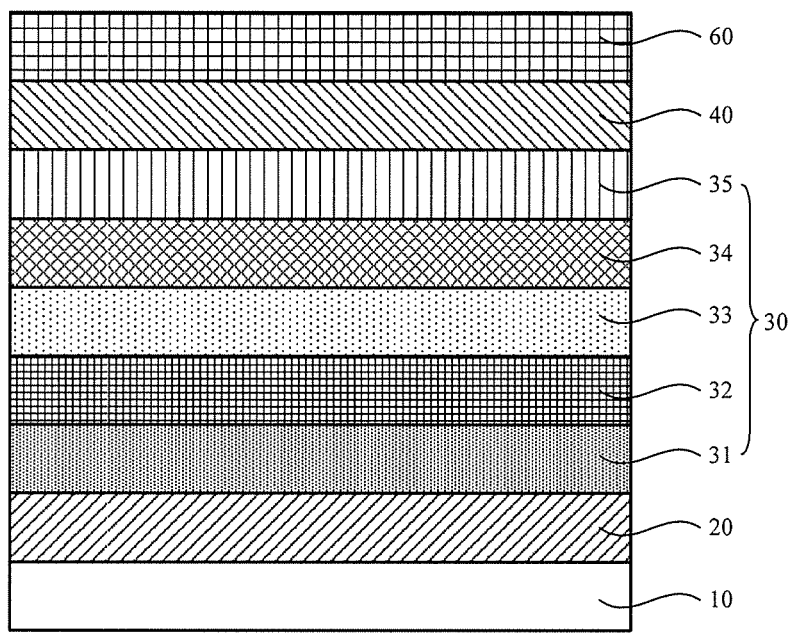
FIG. 1 is a first schematic diagram of the organic light emitting diode device provided by the embodiments of the disclosure.

Please refer to FIG. 1. The embodiments of the present disclosure provide an organic light emitting diode device, which includes: a substrate 10, a first electrode 20, an organic layer 30 and a second electrode 40. The first electrode 20, an organic layer 30 and the second electrode 40 are sequentially disposed on the substrate 10. The first electrode 20 and the second electrode 40 are transparent electrodes. The organic light emitting diode device provided by the embodiments of the present disclosure further includes a metal packaging layer 60. The metal packaging layer 60 is located on a side of the second electrode 40 back to the first electrode 20, wherein a surface of the metal packaging layer 60 facing the second electrode 40 is a rough surface.

For example, please continue referring to FIG. 1. An organic light emitting diode device provided by the embodiments of the present disclosure includes: a substrate 10, a first electrode 20, an organic layer 30, a second electrode 40 and a metal packaging layer 60. The first electrode 20, the organic layer 30, the second electrode 40 and the metal packaging layer 60 are sequentially formed on the substrate 10. The first electrode 20, the organic layer 30, and the second electrode 40 are sequentially arranged on the substrate 10. Optionally, the first electrode 20 is relatively parallel to the second electrode 40 so as to facilitate electrons and holes to move and combine within the organic layer 30, and thus to excite the emitting layer 33 of the organic layer 30 to emit light. The first electrode 20 may be an anode, and the corresponding second electrode 40 is a cathode. Alternatively, the first electrode 20 may be a cathode, and the corresponding second electrode 40 is an anode. In the embodiment of the present disclosure, description is given by taking the first electrode 20 being the anode and the second electrode 40 being the cathode as an example. The first electrode 20 and the second electrode 40 are both transparent electrodes, and further may be made by transparent conductive oxide. For example, the first electrode 20 and the second electrode 40 may be made by Indium Tin Oxide (ITO). The organic layer 30 is located between the first electrode 20 and the second electrode 40. The organic layer 30 includes the light emitting layer 33. The organic layer 30 may further include an electron injection layer 35, an electron transport layer 34, a hole transporting layer 32 and a hole injection layer 31. For example, please refer to FIG. 1. In the case that the first electrode 20 is the anode and the second electrode 40 is the cathode, the organic layer 30 includes the hole injection layer 31, the hole transport layer 32, the light emitting layer 33, the electron transport layer 34 and the electron injection layer 35 from the bottom to the top; and the metal packaging layer 60 is located on a side of the second electrode 40 back to the first electrode 20, and a surface of the metal packaging layer 60 facing the second electrode 40 is a rough surface, that is, the metal packaging layer 60 is located on an upper side of the second electrode 40 in FIG. 1, and a lower surface of the metal packaging layer 60 in FIG. 1 is a rough surface.

When the organic light emitting diode device provided by the embodiments of the present disclosure is working, as shown in FIG. 1, in the case that the first electrode 20 is the anode and the second electrode 40 is the cathode, voltages are applied to the first electrode 20 and the second electrode 40 respectively. The holes output from the first electrode 20 pass through the hole injection layer 31 and the hole transport layer 32 and move to the light emitting layer 33. The electrons output from the second electrode 40 move to the light emitting layer 33 through the electron injection layer 35 and the electron transport layer 34. The holes and the electrons combine in the light emitting layer 33 to form excitons which excite the light emitting layer 33 to emit light. A portion of the light emitted by the light emitting layer 33 passes through the hole transport layer 32, the hole injection layer 31, the first electrode 20 and the substrate 10 and is emergent to the outside of the organic light emitting diode device. Another portion of the light is incident to the metal packaging layer 60 through the electron transport layer 34, the electron injection layer 35 and the second electrode 40. Because the lower surface of the metal packaging layer 60 in FIG. 1 is a rough surface, the another portion of the light will not cause the formation of the SPP mode on the lower surface of the metal packaging layer 60, and this portion of the light is reflected by the lower surface of the metal packaging layer 60. The portion of the light that is reflected by the lower surface of the metal packaging layer 60 is emergent to the outside of the organic light emitting diode device after passing through the second electrode 40, the electron injection layer 35, the electron transport layer 34, the light emitting layer 33, the hole transport layer 32, the hole injection layer 31, the first electrode 20 and the substrate 10. This organic light emitting diode device may be considered as a bottom emitting organic light emitting diode device.

When the organic light emitting diode device provided by the embodiments of the present disclosure is working, voltages are applied to the first electrode 20 and the second electrode 40 respectively. Electrons and holes combine in the light emitting layer 33 of the organic layer 30 to excite the light emitting layer 33 of organic layer 30 to emit light. A portion of the light emitted by the light emitting layer 33 of the organic layer 30 passes through the second electrode 40 and is incident to the metal packaging layer 60. Because the surface of the metal packaging layer 60 facing the second electrode 40 is a rough surface, the portion of the light that is incident to the metal packaging layer 60 will not form the SPP mode on the lower surface of the metal packaging layer 60 facing the second electrode 40 and can be reflected by the metal packaging layer 60, then passes through the second electrode 40, the organic layer 30, the first electrode 40 and the substrate 10, and then finally is emergent to the outside of the organic light emitting diode device.

From above, conditions for forming SPP mode do not exist in the organic light emitting diode device provided by the embodiments of the disclosure, because the surface of the metal packaging layer 60 facing the second electrode 40 is a rough surface. The light emitted from the light emitting layer 33 of the organic layer 30 will not form the SPP mode within the organic light emitting diode device and thus will not be emergent to the outside of the organic light emitting diode device, so as to improve the light extraction efficiency of the organic light emitting diode device.

In addition, for the organic light emitting diode device provided by the embodiments of the disclosure, because the light emitted from the light emitting layer 33 of the organic layer 30 will not form the SPP mode within the organic light emitting diode device and thus will not be emergent to the outside of the organic light emitting diode device, the luminous efficiency of the organic light emitting diode device is improved.

Furthermore, in the case of applying the organic light emitting diode device to a display device, because the light emitted from the light emitting layer 33 of the organic layer 30 will not form the SPP mode within the organic light emitting diode device and thus will not be emergent to the outside of the organic light emitting diode device, the screen display quality of the display device may be improved. For example, the screen display luminance of the display device may be improved, and the energy consumption of the display device may be reduced.

Figure 2:
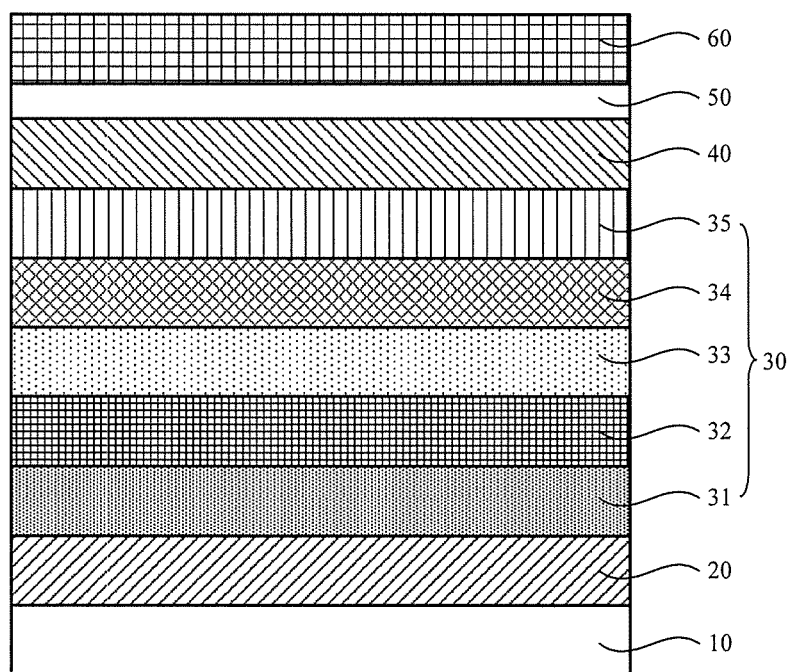
FIG. 2 is a second schematic diagram of the organic light emitting diode device provided by embodiments of the disclosure.

Referring to FIG. 2, the organic light emitting diode device provided by the embodiments of the disclosure further includes a light matching layer 50 between the second electrode 40 and the metal packaging layer 60. The metal packaging layer 60 is attached to the second electrode 40 via the light matching layer 50. Optically Clear Adhesive (OCA), Pressure Sensitive Adhesive (PSA) or the like may be selected and used in the light matching layer 50. Such design, compared with the metal packaging layer 60 directly contacting with the second electrode 40, can improve the fit degree between the metal packaging layer 60 and the second electrode 40, so as to prevent the separation between the metal packaging layer 60 and the second electrode 40.

In the above embodiment, the selection of the material of the light matching layer 50 can be determined according to the refractive index of the second electrode 40. A refractive index of the light matching layer 50 may be required to be matched with the refractive index of the second electrode 40. Optionally, an absolute value of a difference between the refractive index of the light matching layer and that of the second electrode may be smaller than or equal to 0.22. Specifically, the absolute value may be for example 0.05, 0.1, 0.15, or 0.2, etc. Further, the refractive index of the light matching layer 50 may be smaller than that of the second electrode 40. For example, when the material of the second electrode 40 is transparent conductive oxide, materials with refractive index of about 1.8-2.2 may be selected and used in the light matching layer 50. Specifically, the refractive index may be for example 1.8, 1.9, 2.0, 2.1, or 2.2, etc. Based on experiments made by the applicant, it is possible to prevent the light reflected by the metal packaging layer 60 from being totally reflected or partially reflected on the contact interface between the light matching layer 50 and the second electrode 40 by using materials with the refractive index of the above range.

In the above embodiments, the light reflectivity of the metal packaging layer 60 may be greater than or equal to 80%. Optionally, the light reflectivity of the metal packaging layer 60 may be greater than or equal to 90%. In this way, it is possible to prevent the metal packaging layer 60 from absorbing light due to the low light reflectance of the metal packaging layer 60, so that the absorption of the light emitted from the light emitting layer 33 due to internal structures in the organic light emitting diode device can be reduced and the amount of light emergent to the outside of the organic light emitting diode can be increased, thereby the light extraction efficiency of the organic light emitting diode device is improved.

In the above embodiment, the materials of the metal packaging material layer 60 may be various, for example, the material of the metal packaging material layer 60 may be invar alloy, or the material of the metal packaging material layer 60 may be stainless steel, or the material of the metal packaging layer 60 may be one of aluminium, cobalt, nickel, chromium, iron, platinum, palladium, manganese, and silver, or the material of the metal packaging layer 60 may be an alloy consisting of at least two of aluminum, cobalt, nickel, chromium, iron, platinum, palladium, manganese, and silver.

If the material of the metal packaging layer 60 is iron-nickel alloy, since the coefficient of thermal expansion of the iron-nickel alloy is matched with that of the glass commonly used as the substrate 10, deformation, such as warping, bending, and the like, can be reduced in manufacturing the organic light emitting diode device.

If the material of the metal packaging layer 60 is aluminum, silver or aluminum-silver alloy, since the aluminum (light reflectivity 90%), silver (light reflectivity 95%~99%), or aluminum-silver alloy has the higher light reflectivity, the absorption of the light emitted from the light emitting layer 33 by internal structures in the organic light emitting diode device can be further reduced and the amount of light emergent to the outside of the organic light emitting diode can be increased, thereby the light extraction efficiency of the organic light emitting diode device can be further improved. In the case of selecting the aluminum-silver alloy as the material of the metal packaging layer 60, the mass ratio of aluminum to silver in aluminum-silver alloy may be 90:10-95:5. Specially, it may be for example 9:1, 10:1, 11:1, 12:1, 13:1, 14:1, 15:1, 16:1, 17:1, 18:1, or 19:1 and the like. Based on experiments made by the applicant, such aluminum-to-silver mass ratio as designed can make the metal packaging layer 60 has a high light reflectivity and reduce the cost at the same time.

In the above embodiments, the light transmittance of the second electrode 40 may be greater than or equal to 70%, so that the absorption of light by the second electrode 40 is reduced, and the light extraction efficiency of the organic light emitting diode device is further improved. The material of the second electrode 40 may be a conductive oxide, such as Transparent Conductive Oxide (TCO). The material of the first electrode 20 may also be a conductive oxide. In this case, the first electrode 20 and the second electrode 40 are both conductive oxide electrodes.

The embodiments of the present disclosure further provides a display device, the display device is provided with an organic light emitting diode device as described in the above embodiments, to solve the technical problem that a portion of light will not be emergent to the outside of the organic light emitting diode device and thus the light extraction efficiency of the organic light emitting diode device will be reduced.

The display device and the above organic light emitting diode device have the same advantages compared with the existing technology, which here will not elaborate.

Figure 3:
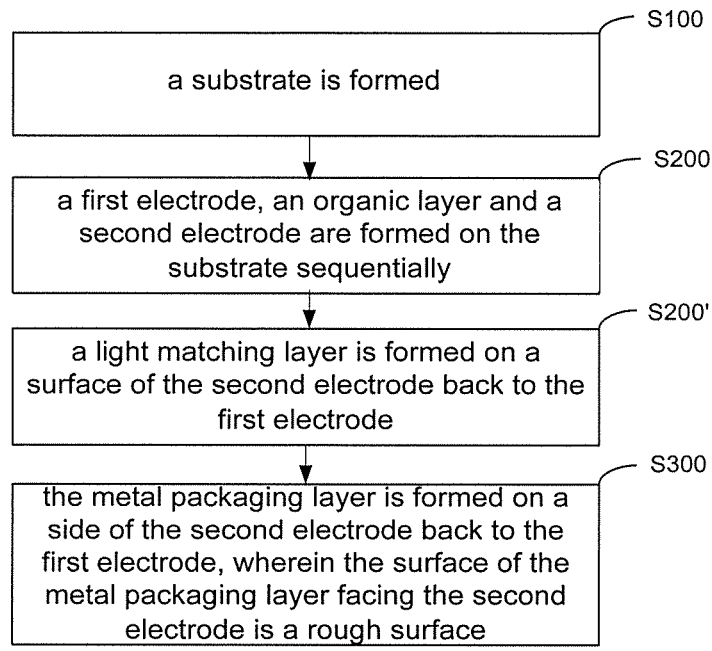
FIG. 3 is a first flow chart of the manufacturing method of the organic light emitting diode device provided by the embodiments of the disclosure.

Please refer to FIG. 3. The embodiments of the present disclosure further provide a manufacturing method of an organic light emitting diode device, used for manufacturing the organic light emitting diode device described in the above embodiments, to solve the technical problem that a portion of light will not be emergent to the outside of the organic light emitting diode device and thus the light extraction efficiency of the organic light emitting diode device will be reduced. The manufacturing method of the organic light emitting diode device includes the following step.

Step S100: a substrate is formed.

Step S200: a first electrode, an organic layer and a second electrode are formed on the substrate sequentially.

Step S300: the metal packaging layer is formed on a side of the second electrode back to the first electrode, wherein the surface of the metal packaging layer facing the second electrode is a rough surface.

Each of the embodiments in this specification is described in a progressive manner. The same or the similar parts among the embodiments can refer to each other. The highlight in each of the embodiments is the difference from the other embodiments. In particular, for the method embodiments, since it is substantially similar to the device embodiments, the description is made relatively simple, and the relevant parts can refer to the parts in the description of the device embodiments.

In the above embodiment, when the step that the metal packaging layer is formed on a side of the second electrode back to the first electrode in step S300 is performed, the metal packaging layer may be formed directly on the side of the second electrode back to the first electrode, or may be formed indirectly. For example, referring to FIG. 4 or FIG. 5, the step S300 that the metal packaging layer is formed on a side of the second electrode back to the first electrode includes the following steps.

Step S310: a metal film is formed on a carrier substrate.

Step S320: the metal film is separated from the carrier substrate, and the metal film is attached to a side of the second electrode back to the first electrode.

Specifically, a metal film may be formed on the carrier substrate, then the metal film is separated from the carrier substrate, and the metal film is attached to a side of the second electrode back to the first electrode so as to form a metal packaging layer. After the formation of the metal film is completed, the surface of the metal film has a certain degree of roughness. Therefore, after the metal film is attached to a side of the second electrode back to the first electrode so as to form a metal packaging layer, the surface of the metal packaging layer facing the second electrode has a certain roughness.

Figure 4:
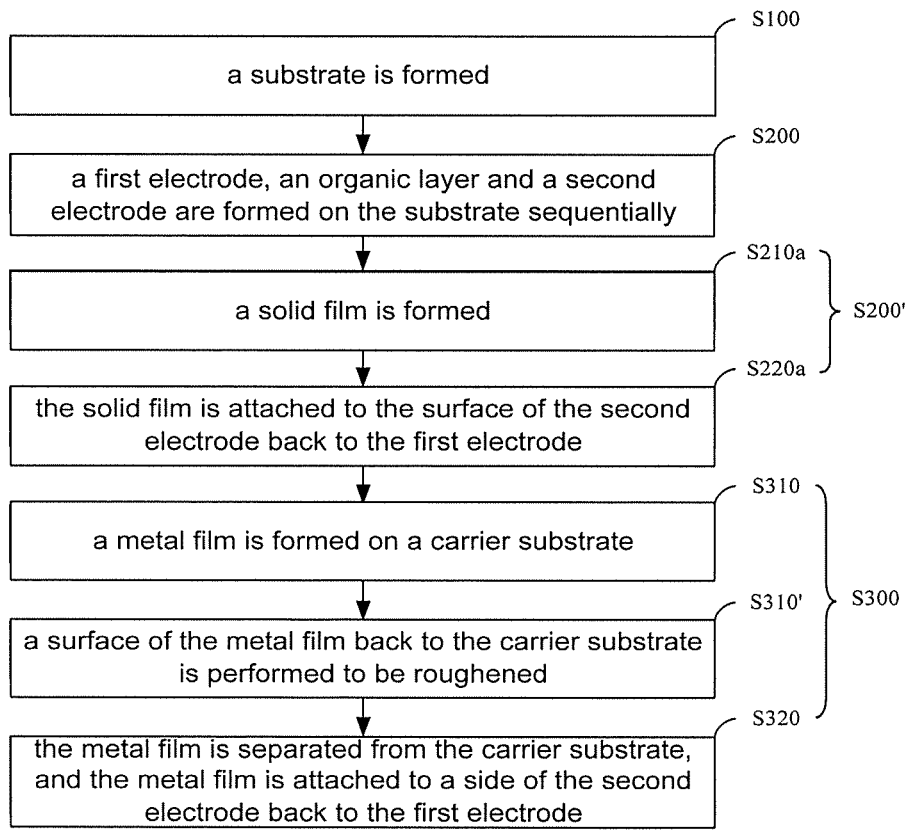
FIG. 4 is a second flow chart of the manufacturing method of the organic light emitting diode device provided by the embodiments of the disclosure.
Figure 5:
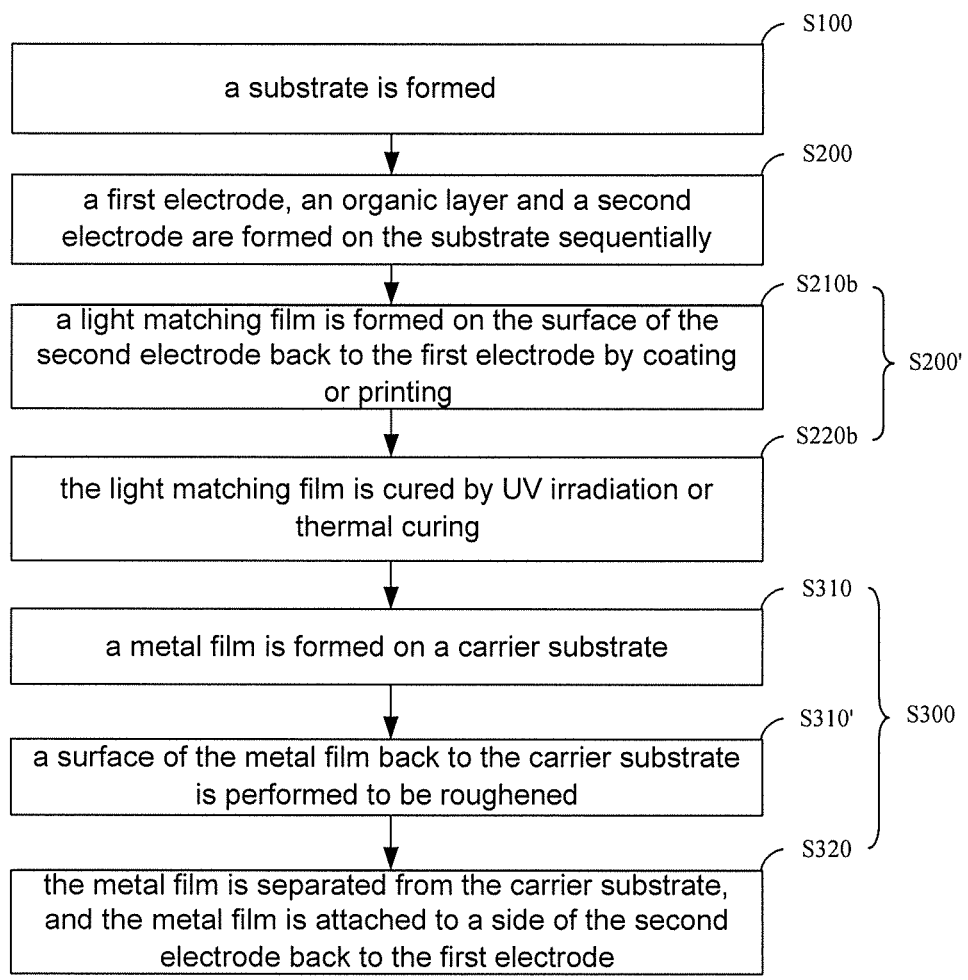
FIG. 5 is a third flow chart of the manufacturing method of the organic light emitting diode device provided by the embodiments of the disclosure.

In order to improve the roughness of the surface of the metal packaging layer facing the second electrode, referring to FIG. 4 or FIG. 5, after the step S310 that a metal film is formed on a carrier substrate, and before the step S320 that the metal film is separated from the carrier substrate and the metal film is attached to a side of the second electrode back to the first electrode, the manufacturing method of the organic light emitting diode device provided by the embodiments of the disclosure further includes:

Step S310': a surface of the metal film back to the carrier substrate is performed to be roughened.

Specifically, after a metal film is formed on a carrier substrate, a surface of the metal film back to the carrier substrate is performed to be roughened, making the roughness of the surface of the metal film back to the carrier substrate conform to the roughness requirement of the rough surface of the metal packaging layer. When the metal film is separated from the carrier substrate and the metal film is attached to a side of the second electrode back to the first electrode, the surface of the metal film back to the carrier substrate faces the second electrode. Such design can control and adjust the roughness of the surface of the metal packaging layer facing the second electrode, thereby further improving the light extraction efficiency of the organic light emitting diode device.

It is worth noting that, in the above embodiments, the order of steps S310, S310', S100 and S200 may be varied. For example, steps S310 and S310' may be performed simultaneously with steps S100, S200, or steps S310 and S310' may be performed before steps S100 and S200, or steps S310 and S310' may be performed after steps S100 and S200. The orders of steps S310, S310', S100 and S200 can include, but not limited to, the above, which here will not elaborate.

Please continue referring to FIG. 3. In the embodiments of the present disclosure, after step S200 that a first electrode, an organic layer and a second electrode are formed on the substrate sequentially, and before S300 that the metal packaging layer is formed on a side of the second electrode back to the first electrode, the manufacturing method of organic light emitting diode device provided by the embodiments of the present disclosure further includes:

Step S200': a light matching layer is formed on a surface of the second electrode back to the first electrode.

In step S200', when a light matching layer is formed on the surface of the second electrode back to the first electrode, a plurality of ways can be used.

For example, referring to FIG. 4, the step S200' that a light matching layer is formed on a surface of the second electrode back to the first electrode includes the following steps.

Step S210*a*: a solid film is formed.

Step S220*a*: the solid film is attached to the surface of the second electrode back to the first electrode.

Alternatively, referring to FIG. 5, the step S200' that a light matching layer is formed on a surface of the second electrode back to the first electrode includes the following steps.

Step S210*b*: a light matching film is formed on the surface of the second electrode back to the first electrode by coating or printing.

Step S220*b*: the light matching film is cured by UV irradiation or thermal curing.

In the description of the above embodiments, the specific features, structures, materials, or characteristics can be combined in an appropriate manner in any one or more embodiments or examples.

As described above, only the specific embodiments of the present disclosure are disclosed, and the scope of the present disclosure is not limited thereto. Those skilled in the art will easily think of that within the technical scope disclosed in the present disclosure, variations or replacement be covered within the scope of the present disclosure. Accordingly, the scope of protection of the present disclosure is subject to the scope of protection of the claims.

Additional embodiments including any one of the embodiments described above may be provided by the disclosure, where one or more of its components, functionalities or structures is interchanged with, replaced by or augmented by one or more of the components, functionalities or structures of a different embodiment described above.

What is claimed is:

1. A manufacturing method of an organic light emitting diode device, comprising:
    forming a substrate;
    forming a first electrode, an organic layer and a second electrode on the substrate successively; and
    forming a metal packaging layer on a side of the second electrode away from the first electrode, wherein a surface of the metal packaging layer facing the second electrode is a rough surface,
    wherein, the step of forming a metal packaging layer on a side of the second electrode away from the first electrode comprises:
    forming a metal film on a carrier substrate; and
    separating the metal film from the carrier substrate, and attaching the metal film to a side of the second electrode away from the first electrode,
    and wherein, after the step of forming a metal film on a carrier substrate, and before the step of separating the metal film from the carrier substrate and attaching the metal film to a side of the second electrode away from the first electrode, the manufacturing method of the organic light emitting diode device further comprises:
    roughening a surface of the metal film away from the carrier substrate.

2. The manufacturing method of the organic light emitting diode device according to claim 1, wherein, after the step of forming a first electrode, an organic layer and a second electrode on the substrate successively, and before the step of forming a metal packaging layer on a side of the second electrode away from the first electrode, the manufacturing method of the organic light emitting diode device further comprises:
    forming a light matching layer on a surface of the second electrode away from the first electrode.

3. The manufacturing method of the organic light emitting diode device according to claim 2, wherein, the step of forming a light matching layer on a surface of the second electrode away from the first electrode comprises:
    forming a solid film; and
    attaching the solid film to the surface of the second electrode away from the first electrode.

4. The manufacturing method of the organic light emitting diode device according to claim 2, wherein, the step of forming a light matching layer on a surface of the second electrode away from the first electrode comprises:
    forming a light matching film on the surface of the second electrode away from the first electrode by coating or printing; and
    curing the light matching film by UV irradiation or thermal curing.

* * * * *